(12) United States Patent
Wang et al.

(10) Patent No.: US 11,594,797 B2
(45) Date of Patent: Feb. 28, 2023

(54) DUALLY ELECTRICALLY TUNABLE 3-D COMPACT RF PHASE SHIFTER

(71) Applicant: University of South Carolina, Columbia, SC (US)

(72) Inventors: Tengxing Wang, Columbia, SC (US); Guoan Wang, Irmo, SC (US)

(73) Assignee: Universtiy of South Carolina, Columbia, SC (US)

(*) Notice: Subject to any disclaimer, the term of this patent is extended or adjusted under 35 U.S.C. 154(b) by 1072 days.

(21) Appl. No.: 16/255,924

(22) Filed: Jan. 24, 2019

(65) Prior Publication Data

US 2019/0229388 A1 Jul. 25, 2019

Related U.S. Application Data

(60) Provisional application No. 62/621,111, filed on Jan. 24, 2018.

(51) Int. Cl.
*H01P 1/18* (2006.01)
*H03H 7/20* (2006.01)
*H01Q 3/36* (2006.01)
*H01F 21/08* (2006.01)

(52) U.S. Cl.
CPC ............. *H01P 1/181* (2013.01); *H01F 21/08* (2013.01); *H01Q 3/36* (2013.01); *H03H 7/20* (2013.01); *H03H 2210/033* (2013.01)

(58) Field of Classification Search
CPC .......... H01P 1/181; H01F 21/08; H01Q 3/36; H03H 7/20; H03H 2210/033
See application file for complete search history.

(56) References Cited

FOREIGN PATENT DOCUMENTS

EP 3125427 * 2/2017
RU 2428774 C1 * 9/2011

* cited by examiner

*Primary Examiner* — Dinh T Le
(74) *Attorney, Agent, or Firm* — Burr & Forman, LLP; Douglas L. Lineberry

(57) ABSTRACT

An electrically tunable radio frequency phase shifter with compact 3-D structure that integrates both ferromagnetic and ferroelectric materials, and utilizes 3-D structure to increase the tuning efficiency and achieve miniaturization.

9 Claims, 20 Drawing Sheets

TABLE 1

SUMMARY OF INDUCTANCE AND Q FACTOR AT 2 GHz

| Measured Results at 2 GHz | Inductance (nH) | Q Factor |
|---|---|---|
| wo/Py | 0.93 | 0.96 |
| w/ Py, dc=0 mA | 1.14 | 0.8 |
| w/ Py, dc=50 mA | 1.09 | 0.77 |
| w/ Py, dc=100 mA | 1.06 | 0.74 |
| w/ Py, dc=150 mA | 1.02 | 0.71 |

FIGURE 5

TABLE II

SUMMARY OF PHASE SHIFT AT 2 GHz

| dc Bias (Voltage, Current) | Phase Shift (°) |
|---|---|
| 0 V, 0 mA | 59.2 |
| 0 V, 150 mA | 53.8 |
| 6 V, 0 mA | 48.8 |
| 6 V, 150 mA | 43.8 |

FIGURE 13

TABLE III

COMPARISON OF TUNABLE PHASE SHIFTERS

| Ref. | Phase Tunability (°/cm) | FOM (°/dB) | dc bias | Magnetic field bias (oe) | Freq. (GHz) |
|---|---|---|---|---|---|
| [11] | 32 | 57 | 200 mA/15 V | No | 2 |
| [24] | N/A | 20.3 | 6 kV/cm | 200 | 5.95 |
| [25] | 20 | 40 | No | 70 | 6 |
| This work | 210 | 11.84 | 150 mA/6 V | No | 2 |

FIGURE 16

DUALLY ELECTRICALLY TUNABLE 3-D COMPACT RF PHASE SHIFTER

This invention was made with government support under National Science Foundation Grant No. 1253929. The government may have certain rights in the invention.

BACKGROUND OF THE INVENTION

1) Field of the Invention

The present invention relates to an electrically tunable radio frequency phase shifter with compact 3-D structure.

2) Description of Related Art

Phase Shifters are a critical component in many RF and Microwave systems. Applications include controlling the relative phase of each element in a phase array antenna in a RADAR or steerable communications link and in cancelation loops used in high linearity amplifiers. The phase of a single tone is meaningless until it is compared to another signal. If the phase of the second signal is varied or shifted, the sine wave of the second signal "moves" relative to sine wave of the first signal. Phase therefore is the fraction of a wavelength difference between two signals and can vary from 0 to 360 degrees. Degrees is also how we measure angles. This leads to an alternative way to view the relative phase of a signal.

In antenna theory, a phased array usually means an electronically scanned array; a computer-controlled array of antennas which creates a beam of radio waves which can be electronically steered to point in different directions, without moving the antennas. In an array antenna, the radio frequency current from the transmitter is fed to the individual antennas with the correct phase relationship so that the radio waves from the separate antennas add together to increase the radiation in a desired direction, while cancelling to suppress radiation in undesired directions. In a phased array, the power from the transmitter is fed to the antennas through devices called phase shifters, controlled by a computer system, which can alter the phase electronically, thus steering the beam of radio waves to a different direction. Since the array must consist of many small antennas (sometimes thousands) to achieve high gain, phased arrays are mainly practical at the high frequency end of the radio spectrum, in the UHF and microwave bands, in which the antenna elements are conveniently small.

Phased arrays were invented for use in military radar systems, to scan the radar beam quickly across the sky to detect planes and missiles. These phased array radar systems are now widely used, and phased arrays are spreading to civilian applications. The phased array principle is also used in acoustics, and phased arrays of acoustic transducers are used in medical ultrasound imaging scanners (phased array ultrasonics), oil and gas prospecting (reflection seismology), and military sonar systems.

The term is also used to a lesser extent for unsteered array antennas in which the phase of the feed power and thus the radiation pattern of the antenna is fixed. For example, AM broadcast radio antennas consisting of multiple mast radiators fed so as to create a specific radiation pattern are also called "phased arrays".

The wireless communication market has been growing faster and faster in recent years, and the demand for supporting multiband and standards is ever-increasing. To achieve multifunctional and frequency-agile systems for modern and next generation wireless applications, compact tunable devices are pivotal. Tunable inductors and tunable phase shifters are among all kinds of tunable devices and have found widespread use in reconfigurable radios. For example, tunable inductors are extensively utilized to realize adaptive inductive power supply and voltage-controlled oscillators, while a tunable phase shifter is the key component to achieve reconfigurable phased array antennas.

To improve the inductance density and achieve tenability of inductors, many technologies have been developed. For example, multiferroic composite materials are employed. The inductance can be tuned by applying DC voltage due to magnetoelectric coupling effect. Another attractive method is directly utilizing ferromagnetic materials as magnetic core to implement tunable solenoid inductors. The permeability of ferromagnetic materials are high and can be tuned by providing biasing magnetic field.

However, due to the low ferromagnetic resonance (FMR) frequency of bulk ferromagnetic cores, the inductance rolls off rapidly when the operating frequency approaches FMR frequency, resulting in the working frequency of those implementations lower than 1 GHz. For the tunable phase shifter design, ferromagnetic and ferrite materials are widely used to achieve the tenability and the ferromagnetic materials are utilized as a substrate or part of a substrate. The phase variation can be obtained by tuning the permeability of the substrate. However, when the phase is only inductively tuned, the equivalent characteristic impedance of the device is inevitably changed, which may cause impedance mismatch. Moreover, for most implementations utilizing ferromagnetic and ferrite materials, an external biasing magnetic field is required for tuning, which may raise integration issues.

Many conventional approaches have been developed to achieve tunable RF phase shifter, such as semiconductor varactors, MEMS, ferroelectrics and ferromagnetics. For semiconductor varactors, complicated biasing network and other auxiliary components (biasing pads, DC block capacitors, RF choke inductors, etc.) are required, which increase the design complexity and area cost. MEMS technology still suffers from reliability issue and high response time, and the tunability introduced by MEMS switch is generally discontinuous. For sole utilization of ferroelectrics or ferromagnetics, only single tunability can be introduced, and for most of conventional tunable phase shifter designs, when phase is tuned, the characteristic impedance is also changed.

Many tunable phase shifter products with single tuning method in the market suffer from deterioration of return loss due to the characteristic impedance variation, such as Voltage Controlled Phase Shifters of Smiths Interconnect, HMC247 Analog Phase Shifter of Analog Devices, nPS series analog phase shifters of nGimat Co., etc.

Accordingly, it is an object of the present disclosure to provide an electrically tunable radio frequency phase shifter with compact 3-D structure. The phase of the device may be tuned by fully electrical methods without any integration issue. The device has dual tunability, which not only greatly increases the tuning range and design flexibility, but provides that when the phase is tuned in a wide range, the impedance can be kept constant.

SUMMARY OF THE INVENTION

In a first embodiment, the current disclosure provides an electrically tunable phase shifter. The phase shifter includes has dual tenability, continuous tenability, includes both ferromagnetic and ferroelectric materials and is comprised of 3-D lumped elements, as well as further comprises at least one tunable solenoid inductor and at least one tunable capacitor. Further, when phase is tuned over a range impedance is kept constant. Yet further, the at least one tunable solenoid comprises Permalloy. Even further, the Permalloy comprises a nickel-iron magnetic alloy. Yet still, the at least one tunable capacitor comprises lead zirconate titanate (PZT). Still yet, the at least one tunable capacitor comprises a structure of metal-insulator-metal. Yet again, the phase shifter is tuned fully electrically by DC current and DC voltage simultaneously or separately without introducing extra an biasing network. Yet even further, length normalized phase tunability is up to at least 210 degree/cm. Further yet, equivalent characteristic impedance of the phase shifter is substantially constant via providing selectively DC biasing conditions. Again, the at least one tunable solenoid inductor comprises a thin film enabled tunable 3-D solenoid inductor. Further yet, the phase shifter includes both inductive and capacitive tenability.

In an alternative embodiment, a method of forming an electrically tunable phase shifter is provided. The method includes fabricating at least one bottom electrode comprising a Pt/Ti bilayer, wherein Ti and Pt are deposited and patterned employing e-beam evaporation and lift-off, fabricating at least one MIM capacitor comprising a PZT film wherein: a PZT precursor is prepared with a sol-gel method; the PZT precursor is spin-coated on a substrate; the resulting PZT film is crystallized; and the PZT film is patterned via wet-etching, fabricating at least one solenoid inductor, wherein a silicon substrate is patterned with at least a first Py layer and a first Au layer, fabricating at least one top electrode of PZT enabled MIM; and depositing Au and patterning with lift-off method to complete the at least one top electrode layer and the at least on MIM capacitor. Further, the at least one tunable solenoid comprises Permalloy. Still yet, the Permalloy comprises a nickel-iron magnetic alloy. Again, the phase shifter is tuned fully electrically by DC current and DC voltage simultaneously or separately without introducing extra an biasing network. Still yet, length normalized phase tenability is up to at least 210 degree/cm. Further yet, equivalent characteristic impedance of the phase shifter is substantially constant via providing selectively DC biasing conditions. Moreover, the at least one solenoid inductor comprises a thin film enabled tunable 3-D solenoid inductor. Still yet, the phase shifter includes both inductive and capacitive tunability.

BRIEF DESCRIPTION OF THE DRAWINGS

The construction designed to carry out the invention will hereinafter be described, together with other features thereof. The invention will be more readily understood from a reading of the following specification and by reference to the accompanying drawings forming a part thereof, wherein an example of the invention is shown and wherein:

FIG. 5 shows Table 1, which provides a summary of Inductance and Q Factor at 2 Ghz.

FIG. 13 shows Table II which provides a summary of phase shift at 2 Ghz.

FIG. 16 shows Table III which provides a comparison of tunable phase shifters.

Figure 1A:
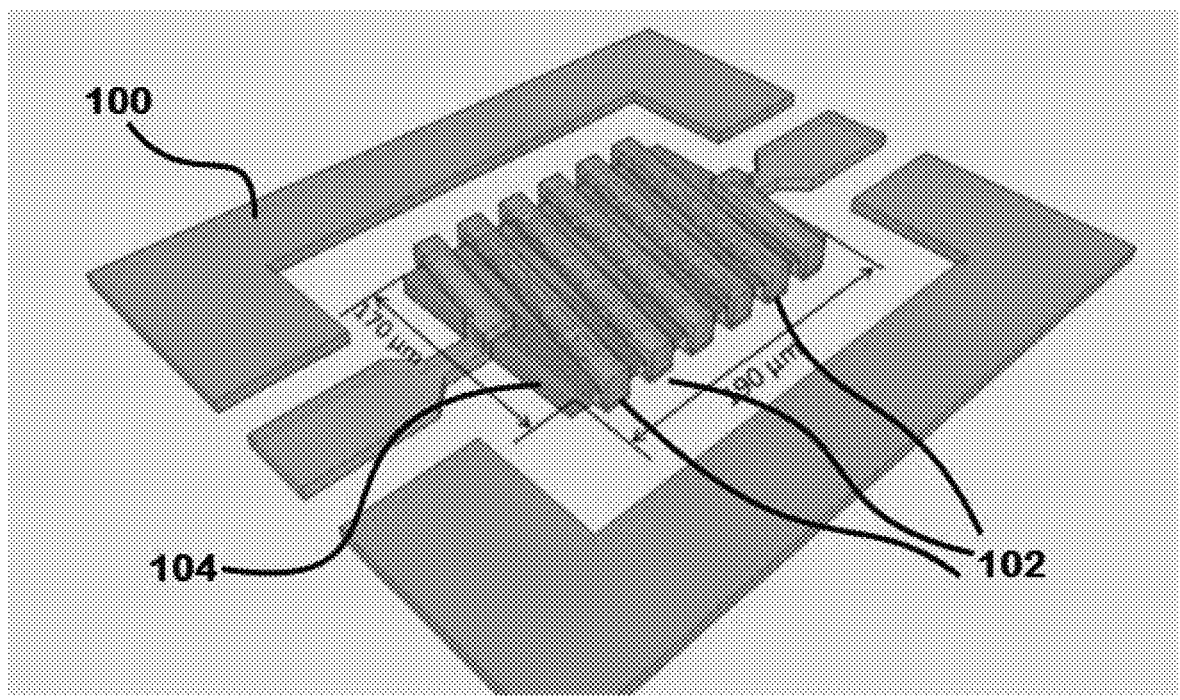
FIG. 1A shows a schematic of a 3-D tunable solenoid inductor of the current disclosure.

It will be understood by those skilled in the art that one or more aspects of this invention can meet certain objectives, while one or more other aspects can meet certain other objectives. Each objective may not apply equally, in all its respects, to every aspect of this invention. As such, the preceding objects can be viewed in the alternative with respect to any one aspect of this invention. These and other objects and features of the invention will become more fully apparent when the following detailed description is read in conjunction with the accompanying figures and examples. However, it is to be understood that both the foregoing summary of the invention and the following detailed description are of a preferred embodiment and not restrictive of the invention or other alternate embodiments of the invention. In particular, while the invention is described herein with reference to a number of specific embodiments, it will be appreciated that the description is illustrative of the invention and is not constructed as limiting of the invention. Various modifications and applications may occur to those who are skilled in the art, without departing from the spirit and the scope of the invention, as described by the appended claims. Likewise, other objects, features, benefits and advantages of the present invention will be apparent from this summary and certain embodiments described below, and will be readily apparent to those skilled in the art. Such objects, features, benefits and advantages will be apparent from the above in conjunction with the accompanying examples, data, figures and all reasonable inferences to be drawn therefrom, alone or with consideration of the references incorporated herein.

DETAILED DESCRIPTION OF A PREFERRED EMBODIMENT

With reference to the drawings, the invention will now be described in more detail. Unless defined otherwise, all technical and scientific terms used herein have the same meaning as commonly understood to one of ordinary skill in the art to which the presently disclosed subject matter belongs. Although any methods, devices, and materials similar or equivalent to those described herein can be used in the practice or testing of the presently disclosed subject matter, representative methods, devices, and materials are herein described.

Unless specifically stated, terms and phrases used in this document, and variations thereof, unless otherwise expressly stated, should be construed as open ended as opposed to limiting. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise.

Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent.

The proposed tunable phase shifter of the current disclosure solves the limitations described supra by integrating both ferromagnetic and ferroelectric materials, and utilizing 3-D structure to increase the tuning efficiency and achieve miniaturization. The two materials are well integrated with the RF phase shifter of the current disclosure so that no extra area is introduced. The DC current and DC voltage are applied between two ports of components and between one port and ground, respectively, so no biasing network or auxiliary components are needed. The tunability of the proposed tunable device is continuous and the response time is very low, within the nano second range. The invention can be used particularly in the 5G wireless communication to achieve multi-functional and frequency-agile systems that requires low cost, high reliability, high integration and high performance, (e.g., reconfigurable phase array antennas).

The current disclosure provides a novel fully electrically tunable phase shifter with both inductive and capacitive tunability for RF wireless communication system. The tunable phase shifter may be constructed with 3-D lumped elements and may be composed of tunable solenoid inductors and tunable capacitors. For the tunable solenoid inductor, Permalloy, a kind of ferromagnetic material with high and tunable permeability, is selectively patterned and integrated with a special configuration to construct the magnetic core. The inductance density of solenoid inductor is thus significantly improved and the inductance can be tuned by applying DC current. Permalloy typically is a nickel-iron magnetic alloy, with about 80% nickel and 20% iron content notable for its very high magnetic permeability, which makes it useful as a magnetic core material in electrical and electronic equipment, and also in magnetic shielding to block magnetic fields. Commercial permalloy alloys typically have relative permeability of around 100,000, compared to several thousand for ordinary steel.

In addition to high permeability, its other magnetic properties are low coercivity, near zero magnetostriction, and significant anisotropic magnetoresistance. The low magnetostriction is critical for industrial applications, allowing it to be used in thin films where variable stresses would otherwise cause a ruinously large variation in magnetic properties. Permalloy's electrical resistivity can vary as much as 5% depending on the strength and the direction of an applied magnetic field. Permalloys typically have the face centered cubic crystal structure with a lattice constant of approximately 0.355 nm in the vicinity of a nickel concentration of 80%. A disadvantage of permalloy is that it is not very ductile or workable, so applications requiring elaborate shapes, such as magnetic shields, are made of other high permeability alloys such as mu metal. Permalloy is used in transformer laminations and magnetic recording heads.

The tunable capacitor is enabled by integrating PZT, a kind of ferroelectric materials with high and tunable permittivity, and when DC voltage is provided, the capacitance is tunable. PZT, or lead zirconate titanate, an inorganic compound with the chemical formula $Pb[Zr_xTi_{1-x}]O_3$, is one of the world's most widely used piezoelectric ceramic materials. When fired, PZT has a perovskite crystal structure, each unit of which consists of a small tetravalent metal ion in a lattice of large divalent metal ions. In the case of PZT, the small tetravalent metal ion is usually titanium or zirconium. The large divalent metal ion is usually lead. Under conditions that confer a tetragonal or rhombohedral symmetry on the PZT crystals, each crystal has a dipole moment. PZT materials, and piezoelectric materials more generally, exhibit a unique range of properties. In a basic sense, if a piezoelectric material is deformed, an electric charge is generated in what is known as the piezoelectric effect. The opposite of this phenomenon also holds true: if an electric field is applied to a piezoelectric material, deformation occurs in what is known as the inverse piezoelectric effect.

With the integration of both Permalloy and PZT, the phase of the phase shifter can be tuned fully electrically by DC current and DC voltage simultaneously or separately without introducing extra an biasing network and other auxiliary components, which greatly increase the design flexibility and reduces the area cost of the device of the current disclosure. This dual tunability significantly increases the phase tuning range, and the length normalized phase tenability of the current disclosure has reached 210 degree/cm. Moreover, the dual tunability of phase shifter enables the capability of characteristic impedance retaining, by which when selective DC biasing conditions are applied, the phase can be tuned in a wide range while the characteristic impedance can be kept constant. The characteristic impedance retaining significantly solves the limitation of some traditional tunable phase shifters with single tuning topology where the characteristic impedance is changed inevitably while the phase is tuned. The tunable phase shifter can be widely used to construct tunable phase array antennas and beam forming networks, and other reconfigurable wireless communication systems.

In a further embodiment a Permalloy (Py) thin film enabled tunable 3-D solenoid inductor is designed and fabricated. By selectively patterning Py thin film, the proposed tunable inductor can work at frequencies up to the several GHz range. The inductance of the solenoid inductor can be electrically tuned by DC current and the tunability is above 10%. Utilizing the implemented Py enabled tunable solenoid inductor and Lead Zirconate Titanate thin film enabled metal-insulator-metal capacitor, a compact fully electrically tunable lumped elements phase shifter is achieved.

The tunable phase shifter has both inductive and capacitive tunability and the dual tunability significantly improves the tuning range and design flexibility. Moreover, the dual tenability is able to retain the equivalent characteristic impedance of the device in the process of the phase being tuned. The phase of the device can be tuned by fully electrical methods and when DC current and DC voltage are provided, the length normalized phase tunability is up to 210°/cm.

The methodology of integrating both ferromagnetic and ferroelectric materials to design fully electrical tunable microwave components and step impedance transmission lines with permalloy (Py) thin film patterns on top of the signal lines were implemented and demonstrated. The inductive tenability is dependent on the effective static magnetic field generated by the applied DC current. However, the magnetic field on top surface of signal lines is not uniform due to the planar structure configuration, and only a very small part of magnetic field loop near the Py patterns can be effectively used for tuning, resulting in small inductive tunability.

For the current disclosure, a new tunable inductor is implemented utilizing 3-D solenoid structure with specially designed magnetic core. A lumped element tunable phase shifter is constructed with the developed 3-D solenoid inductor and tunable metal-insulator-metal (MIM) capacitor. Compared with previous devices, tuning efficiency of the DC bias has been greatly improved due to confined magnetic field inside the magnetic core of 3-D solenoids. Much less DC bias is required to achieve the same tunability, and better characteristic impedance retaining capability has been achieved. Moreover, the utilization of 3-D structure introduces significant size miniaturization. The proposed novel 3-D tunable solenoid inductor with a Py thin film enabled magnetic core is demonstrated infra.

Py is utilized due to its good properties of high saturation magnetization, low coercivity, and low magnetostriction. The Py thin film is selectively patterned and the working frequency of the inductor has been improved to several GHz. Based on the implemented tunable inductor, the current disclosure proposes a lumped element tunable phase shifter designed by integrating lead zirconate titanate (PZT) enabled MIM capacitors and the implemented 3-D solenoid. PZT is a kind of ferroelectric material with high and tunable permittivity. By integrating Py and PZT thin films, the tunable phase shifter obtains both inductive and capacitive tunability, and the dual tunability not only provides more flexibility for tuning, but also enables the device to retain the constant equivalent characteristic impedance while the phase is being tuned. The current disclosure also provides how to construct the magnetic core of the solenoid inductor.

Design

Figure 1B:
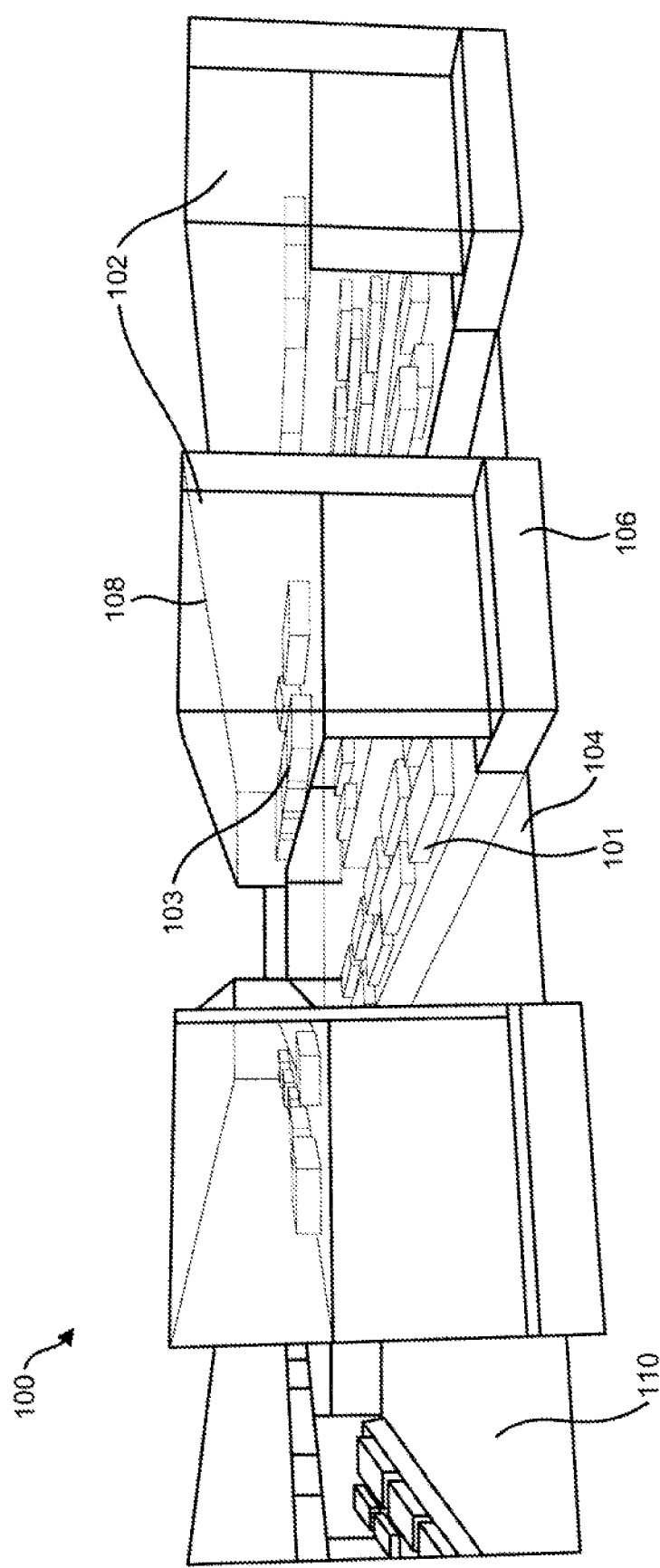
FIG. 1B shows a magnified, partial view of FIG. 1.

The current disclosure provides a solenoid inductor with six turns, however, more or less turns are considered within the scope of this disclosure such as 2, 3, 4, 5, 7, 8, 9, 10, etc., see FIG. 1A. FIG. 1B shows the schematic of implemented solenoid inductor 100 and magnified partial view, respectively. FIG. 1A shows solenoid inductor 100 and coils/turns 102. The solenoid structure is utilized due to its capability of efficiently taking advantage of magnetic core 104, and largely confining the magnetic flux to the coils/turns 102. Py is used to construct magnetic core 104 of solenoid inductor 100.

However, due to the high conductivity of Py, it cannot be used directly, and a novel methodology is adopted to design the magnetic core. Two layers of Py thin films are exploited, with a thickness of 100 nm for each layer. The first layer 101 of Py was deposited on top of the gold (Au) wires of the bottom solenoid layer 106, while the second Py layer 103 was configured beneath the Au wires of top solenoid layer 108, which is shown in FIG. 1B. To separate the top and bottom layers of solenoid winding as well as the two Py thin film layers, a layer of silicon dioxide ($SiO_2$) 110 is used as insulator. Therefore, the two layers of Py thin films and the $SiO_2$ insulator form a sandwich-like magnetic core for the solenoid inductor. The dimension of magnetic core may be 190×170 µm, and the total area of the solenoid inductor may be smaller than 0.05 $mm^2$. To improve the FMR frequency, Py thin film is patterned as long bars with a large aspect ratio to introduce the shape anisotropy and the Py patterns may be 50 µm long and 5 µm wide, and may have a thickness of 100 nm. In the RF range, the hard axis permeability of Py patterns is higher than that of easy axis, which is perpendicular to the hard axis. It is because the magnetic flux along the hard axis is governed by the rotational magnetization, and the amount of magnetic flux associated with the coil current can be effectively increased, resulting in significant improvement of inductance. In contrast, the magnetic domain movement is significant along the easy axis, resulting in large eddy current loss. Therefore, to achieve more inductance enhancement, the orientation of Py patterns is intentionally parallel to the Au wires so that hard axis permeability may be excited when RF signal is provided. To analyze inductance enhancement and tunability caused by the integration of Py thin film, a regular solenoid inductor without Py thin film was fabricated for comparison. The regular solenoid inductor had the same dimension as the Py enabled tunable inductor and utilized the same $SiO_2$ as insulator.

Fabrication

Figure 2A:
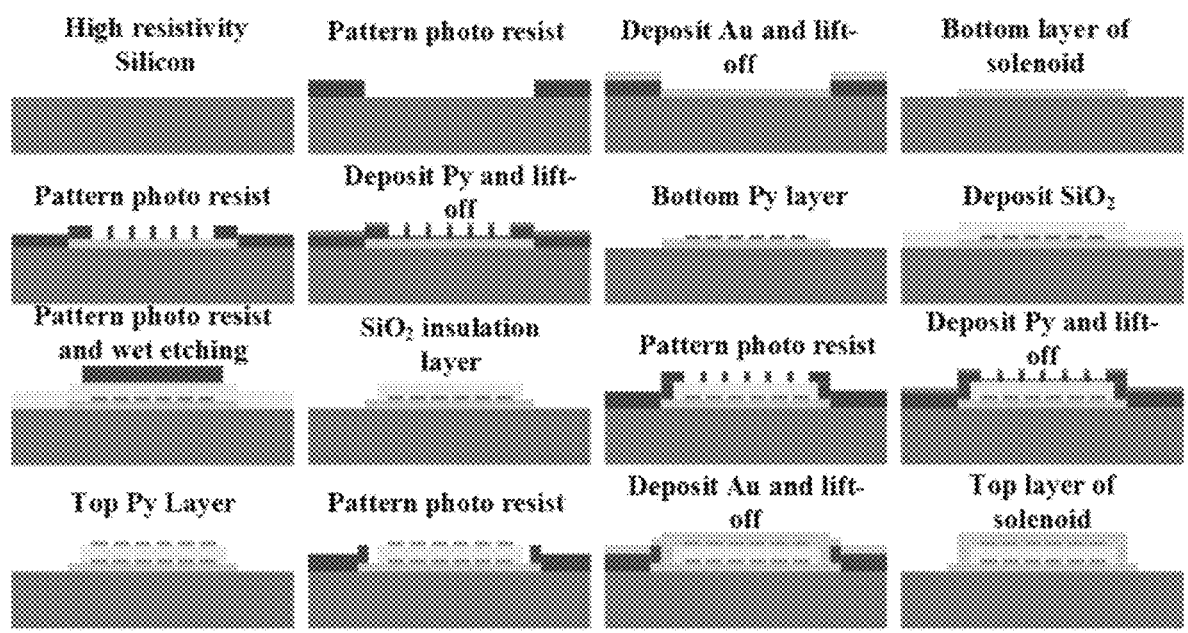
FIG. 2A shows a surface micromachining process of a 3-D tunable solenoid inductor of the current disclosure.
Figure 2B:
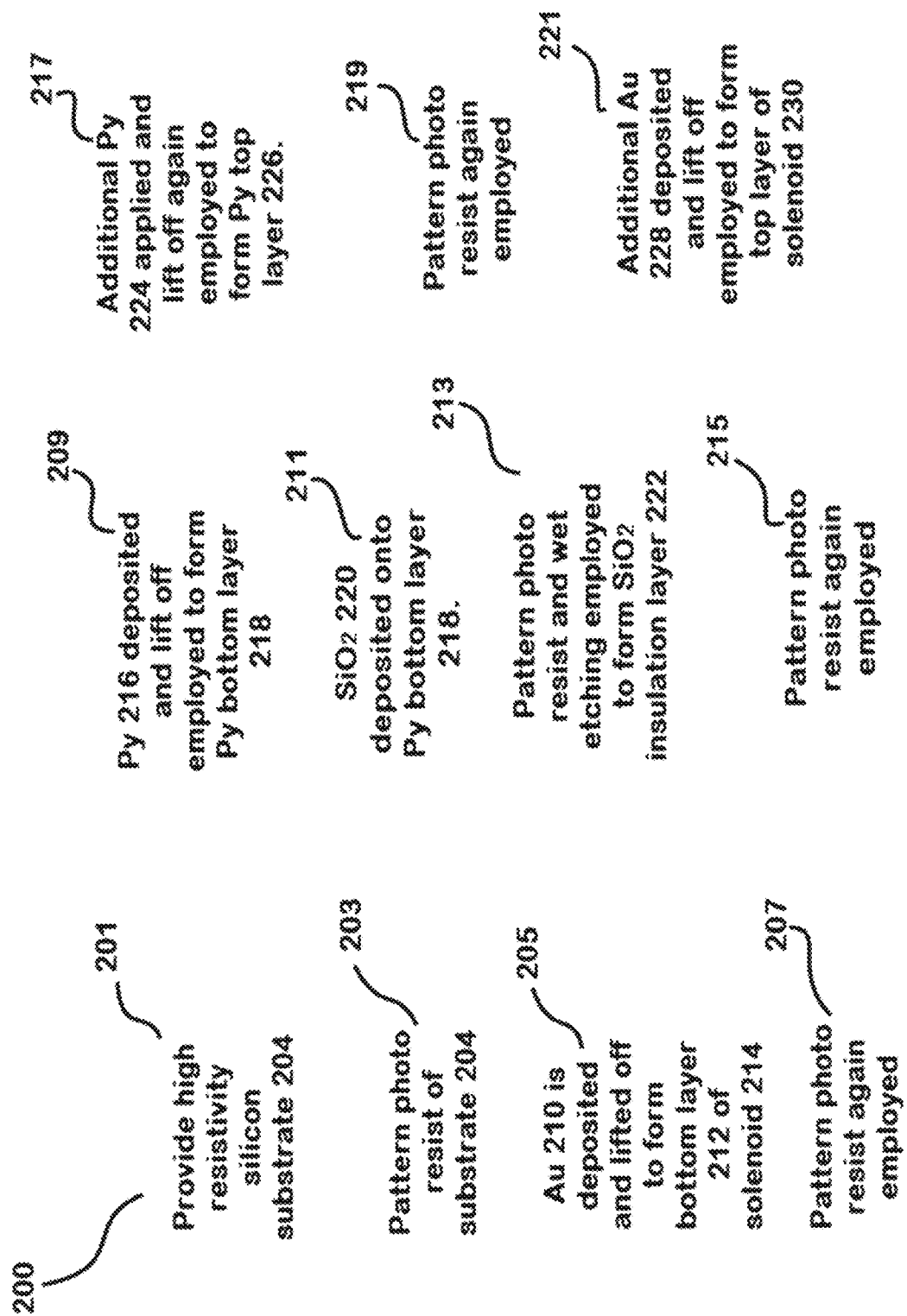
FIG. 2B shows a schematic process of FIG. 2A.

The solenoid inductor was fabricated on the high resistivity (10 k ohm-cm) silicon wafer utilizing surface micromachining techniques. The process is shown in FIG. 2A. FIG. 2B shows a schematic 200 of FIG. 2A. At step 201, a high resistivity silicon substrate 204 is provided. At step 203, pattern photo resist is used on substrate 204. Pattern photo resist is the process of photolithography in order to make the photo resist have the required pattern/shape on the substrate, as known to those of skill in the art. At step 205, Au 210 is deposited and lifted off forming bottom layer 212 of solenoid 214. At step 207, pattern photo resist is again used. At step 209, Py 216 is deposited and lift off is employed to form bottom Py bottom layer 218. At step 211, $SiO_2$ 220 is deposited onto Py bottom layer 218. At step 213, pattern photo resist and wet etching are employed to form $SiO_2$ insulation layer 222. At step 215, pattern photo resist is again employed. At step 217 additional Py 224 is applied and lift off is again employed to form Py Top Layer 226. At step 219, pattern photo resist is again employed. At step 221, additional Au 228 is deposited and lift off is employed to form top layer of solenoid 230.

Bottom layer 212, Au layer, of solenoid winding was deposited with E-beam evaporation method and patterned with lift-off process. The thickness of the bottom Au layer was measured to be 300 nm. 100-nm thick Py thin film 216 was then deposited on top of the bottom solenoid Au wires utilizing DC magnetron sputtering and was patterned as long bars using lift-off method. Then $SiO_2$ with a thickness of 800 nm was deposited with inductively coupled plasma chemical vapor deposition and was patterned with wet etching to form the insulator between top and bottom layer of solenoid winding.

The dimension of the $SiO_2$ insulation layer was carefully controlled so that the Py patterns were fully covered while the endings of bottom solenoid Au wires were exposed to connect with the solenoid top layer. Before the deposition of top Au layer, another 100 nm-thick Py was deposited and patterned with lift-off process. Afterwards, 1-µm-thick top Au layer was deposited and lift-off method was used for patterning to form the top layer of solenoid windings. The thickness settings of Au layers of solenoid winding, Py thin film patterns, and SiO$_2$ insulation layer take the fabrication capability and limitations into consideration. The small thickness of Au solenoid winding, especially the bottom layer of solenoid winding, whose thickness is only 300 nm, causes deterioration of the quality factor and it will be shown infra.

Measurement Results and Discussions

Figure 3:
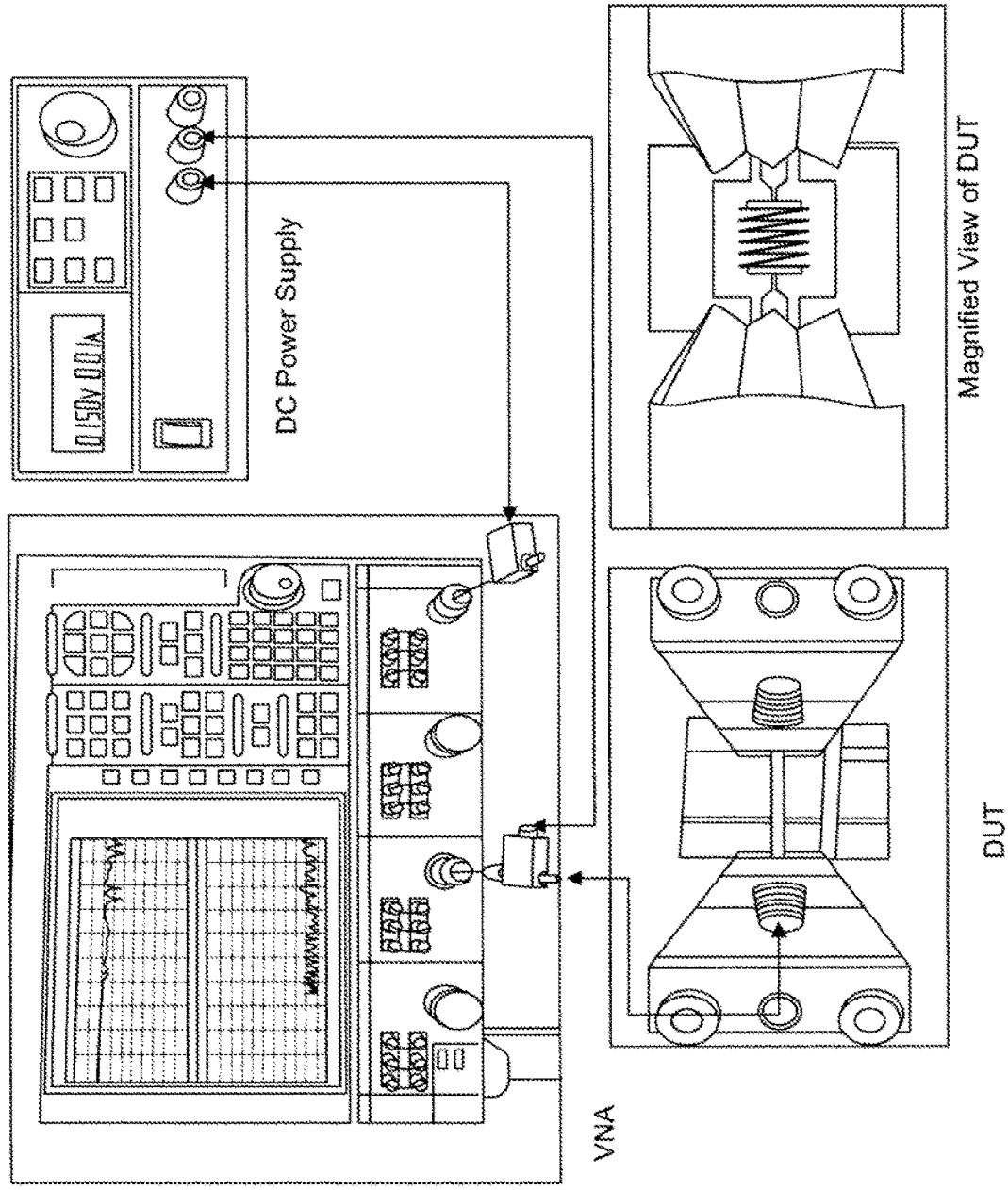
FIG. 3 shows a block diagram of a measurement setup and DUT.

The properties of the two fabricated solenoid inductors with and without Py thin film were measured, respectively. On-wafer testing was conducted utilizing GSG RF probes and R&S ZVA67 vector network analyzer was used to extract the scattering parameters of implemented solenoid inductors. A power source was used to provide different biasing DC current. RF signal and DC current were simultaneously provided through bias tees to the device-under-test (DUT). FIG. 3 shows a block diagram of the measurement setup and the inset at lower right is the photo of DUT. Through-reflect-line calibration was utilized to de-embed the losses from connectors, bias tees, RF cables, and the parasitic effects of GSG pads of DUT.

The de-embedded S-parameters were then transformed to obtain Y-parameters, and the inductance and quality factor of solenoid inductors can be denoted as follows:

$$L = \text{Im}(1/Y_{11}/\omega) \quad (1)$$

$$Q = -\text{Im}(Y_{11})/\text{Re}(Y_{11}) \quad (2)$$

where $\omega$ and $Y_{11}$ represent the angular frequency and reflection Y-parameter at port 1, respectively.

Figure 4A:
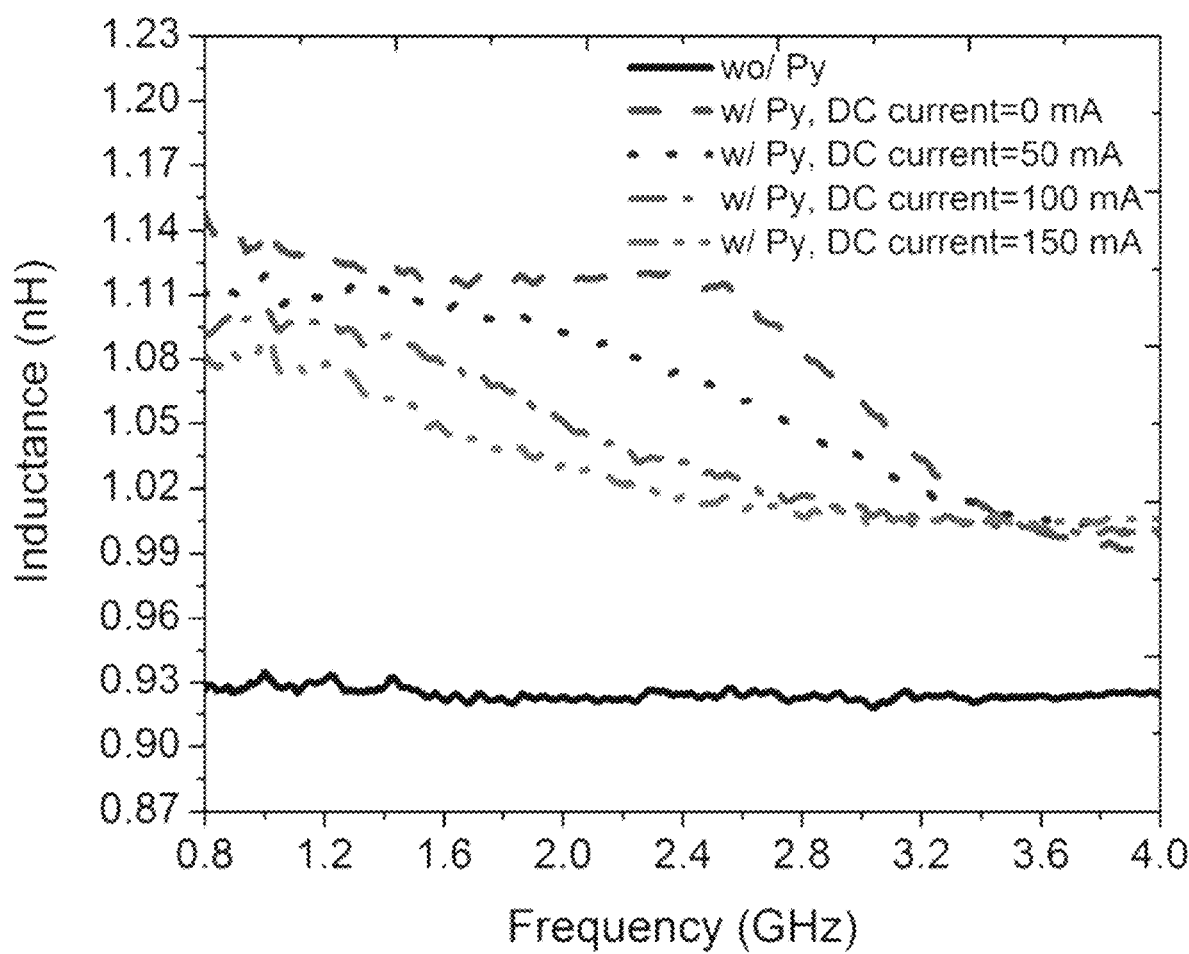
FIG. 4A shows measurement results of inductance.
Figure 4B:
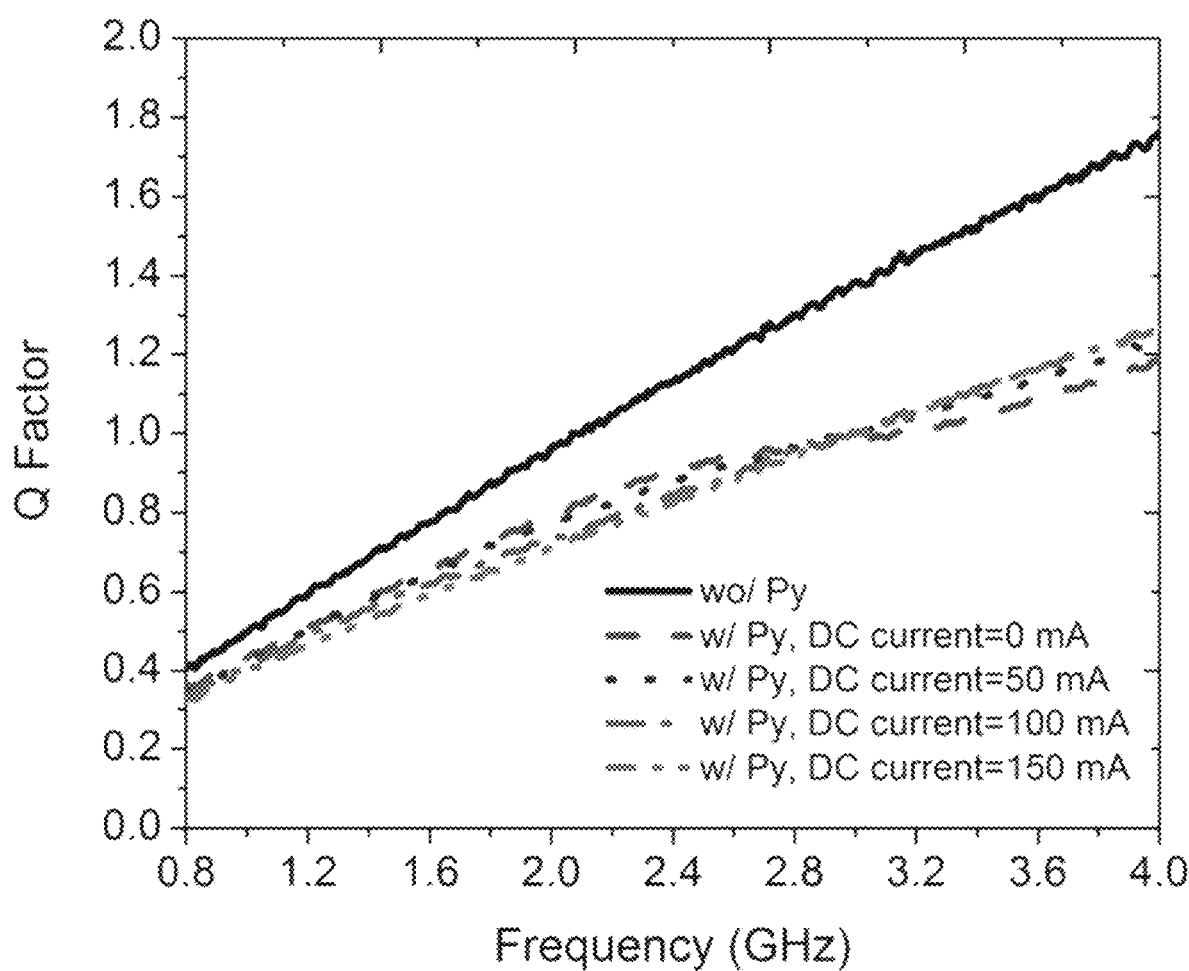
FIG. 4B shows Q factor at different frequencies under direct DC current.

FIGS. 4A and 4B show the measured results regarding to the inductance and quality factor versus frequency under different DC currents. Table I, see FIG. 5, summarizes the measurement results at 2 GHz. It is obvious that compared to regular solenoid inductor, Py thin film introduces significant inductance improvement, due to its high permeability. At 2 GHz, the inductance of regular solenoid inductor is 0.93 nH while the Py enabled solenoid inductor shows the inductance of 1.14 nH, which is a 22.6% improvement. When different biasing DC currents are provided, the inductance of Py enabled solenoid inductor can be continuously tuned. At 2 GHz, when DC current is increased from 0 to 150 mA, the inductance is correspondingly decreased from 1.14 to 1.02 nH, which is 10.5% tunability. The inductance tunability of Py enabled solenoid inductor is due to the permeability variation of Py thin film under DC biasing condition. When DC current is provided to the solenoid inductor, a static magnetic field with highly uniform intensity and direction is generated, and is confined to the interior of the solenoid. The direction of the static magnetic field is along the long axis of solenoid and is parallel to the hard axis of Py patterns. The static magnetic field causes the rotational movement of magnetization and tilts the magnetization away from its easy axis toward the hard axis, resulting in the reduction of the effective permeability.

Figure 6:
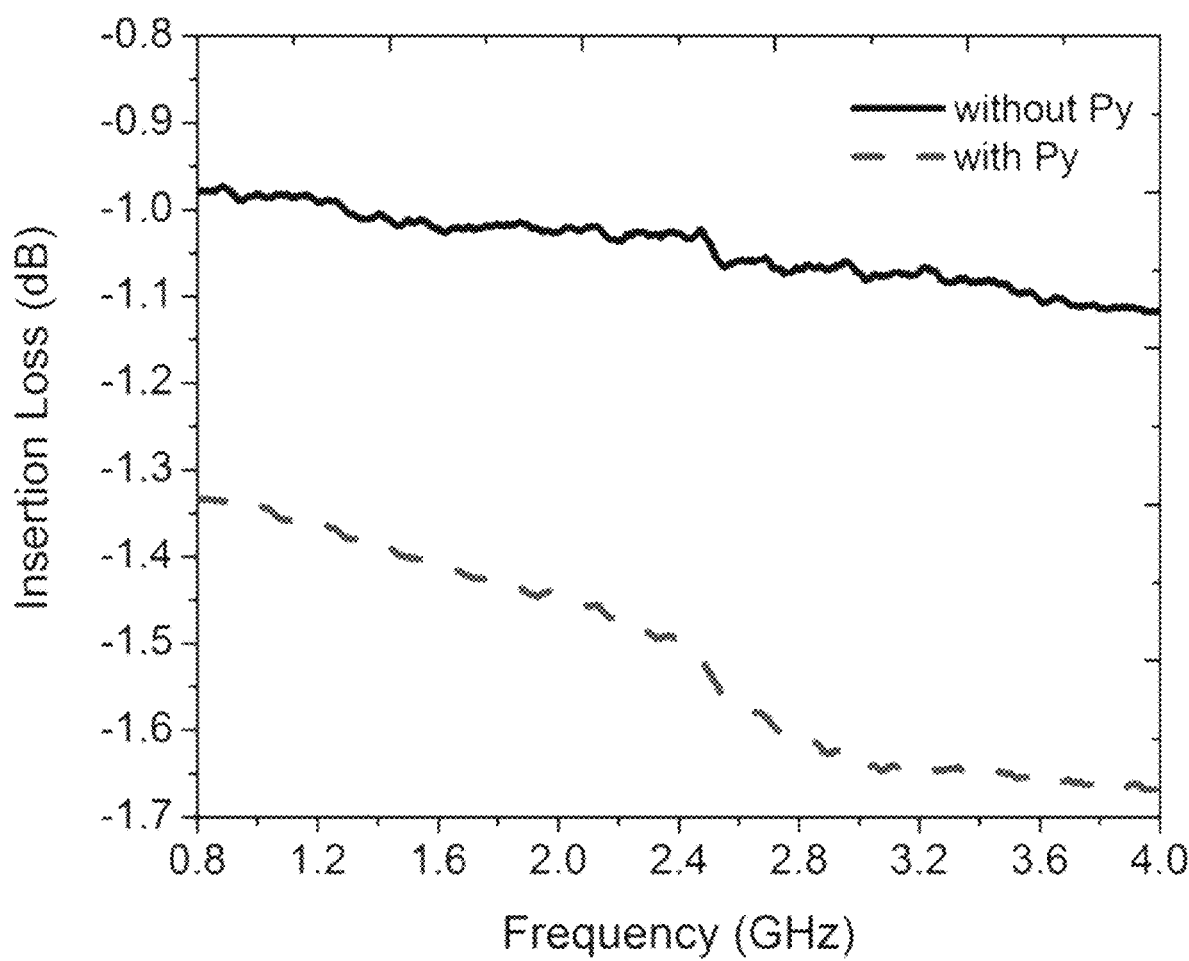
FIG. 6 illustrates measured results of insertion loss of solenoid inductor with and without Py thin film.

Compared with conventional solenoid inductors utilizing solid ferromagnetic materials as magnetic core, selectively patterning Py thin film effectively increases the FMR frequency and the working frequency of Py enabled solenoid is significantly improved. It is shown in FIG. 4A that the operation frequency of tunable solenoid inductor is up to 3.2 GHz with significant inductance enhancement and tunability. The roll-off of inductance mainly attributes to the rapid increasing of eddy current loss inside the Py thin film along with the frequency. The quality factor measurement results in FIG. 4B and Table I, see FIG. 5, show that integrating Py thin films causes slight quality factor deterioration. Compared with a regular solenoid inductor, Py enabled solenoid inductor reduces the Q factor from 0.96 to 0.8. The extra eddy current loss introduced by Py thin film contributes to the decrease of Q factor. Moreover, as the working frequency is increased, the Q factor difference between regular solenoid inductor and Py enabled solenoid inductor becomes larger, due to the more rapid increase of eddy current inside the Py thin film. To evaluate the amount of loss introduced by integrating Py thin film, the measured insertion loss of solenoid inductors with and without Py is depicted in FIG. 6. It is clearly shown that extra 0.4-dB loss is introduced by Py thin film at 2 GHz.

Laminating thinner layers of Py thin films separated with high quality dielectrics can effectively reduce the induced eddy current loss. Since the thickness of each Py thin film is greatly reduced, its resistance is significantly increased, resulting in the decrease of induced eddy current and the correspondent loss. Moreover, utilizing lamination structure can effectively increase the effective permeability and improve the inductive tunability.

To prove the concept and validate the efficacy of using lamination structure to improve the performance, qualitative magnetic simulation is conducted with Object Oriented Micromagnetic Framework proposed in O. Gérardin, H. Le Gall, M. J. Donahue, and N. Vukadinovic, "Micromagnetic calculation of the high frequency dynamics of nano-size rectangular ferromagnetic stripes," J. Appl. Phys., vol. 89, no. 11, pp. 7012-7014, 2001. The magnetic susceptibility of two Py bars are characterized and compared. One of the bars has single Py thin film layer with the thickness of 200 nm and the other is composed of two laminated Py layers, with each layer being 100 nm thick, so that the total thickness of the ferromagnetic layer of the two bars is identical. The two laminated Py layers are separated by a layer of 50-nm-thick dielectric material. The dimensions of the two bars are both 10×1 μm. Biasing magnetic field is applied along the short edge of the Py bars, which is parallel to the hard axis of the pattern, to tune the susceptibility.

Figure 7:
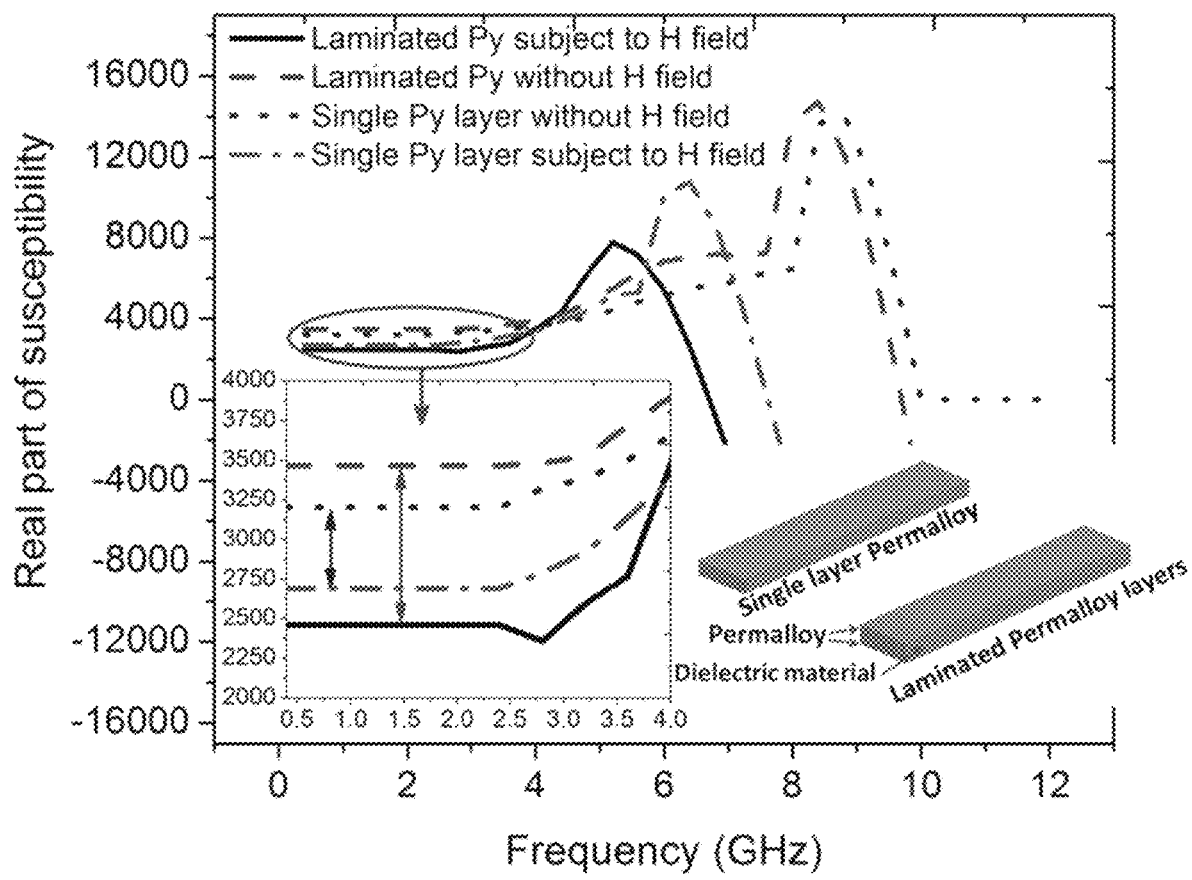
FIG. 7 shows simulated susceptibility of single layer and lamination structure.

FIG. 7 shows the simulation results regarding the magnetic susceptibility of single layer and lamination structure. Apparently lamination structure shows larger susceptibility than single layer structure, seen in the inset of FIG. 7. When a biasing magnetic field is provided, the susceptibility of both structures is reduced, and lamination structure introduces more variation. The improvement of susceptibility and inductive tunability introduced by lamination is mainly due to the suppression of strip/vortex domains, which can cause the deterioration of permeability of magnetic thin films.

The domain structure and mechanism will be further explored. The small Q factor and relatively high insertion loss mainly attribute to the small thickness of Au wires of solenoid winding as mentioned before. To increase the Q factor, fabrication process needs to be optimized such that thicker Au can be deposited. The Joule heating effect should be considered in case of applying DC current to the solenoid inductor for tuning. When DC current is provided, the temperature of the device is increased due to the existence of DC resistance. The thermal energy can cause such effects as enhanced magnetization rotation, domain reconfiguration, and domain wall depinning, and can contribute to tilt the magnetization orientation away from easy axis to the hard axis, resulting in the variation of permeability. The temperature increment can be estimated by the variation of DC resistance. When DC current is provided can then be obtained by calculation. In the measurement, the maximum DC current of 150 mA and a small current of 1 mA are applied, respectively, and the variation of DC resistance is about 0.5Ω. The corresponding temperature increment of $\Delta T=25°$ C. can be estimated from $R=R_0[1+\beta(T-T_0)]$ according to, where R and $R_0$ are the final DC resistance and initial DC resistance of the device, respectively; T and $T_0$ are the final temperature and initial temperature of the device, respectively. $\beta$ is the resistivity temperature coefficient of Au and the value is $3.4\times10^{-3}/°$ C. The saturation magnetization variation can be estimated from Bloch's $T^{3/2}$ law: Ms (T)=Ms (0)$(1-AT^{3/2})$, where A is a material dependent coefficient. According to the calculation, the decrease of saturation magnetization is less than 1%. Due to the negligible variation of saturation magnetization, the inductive tenability can be mainly attributed to the biasing static magnetic field generated by the applied DC current rather than the thermal effect.

Py and PZT Enabled Tunable Phase Shifter

The previous section demonstrates the methodology utilizing patterned Py thin film to construct magnetic core and implementing an electrically tunable solenoid inductor. In this section, the achieved Py enabled tunable solenoid inductors and PZT enabled tunable MIM capacitors are employed to construct a fully electrically lumped element tunable phase shifter. The implemented tunable phase shifter has both inductive and capacitive tunability with fully electrical tuning method, which is DC current and/or DC voltage.

Theory and Design

Figure 8:
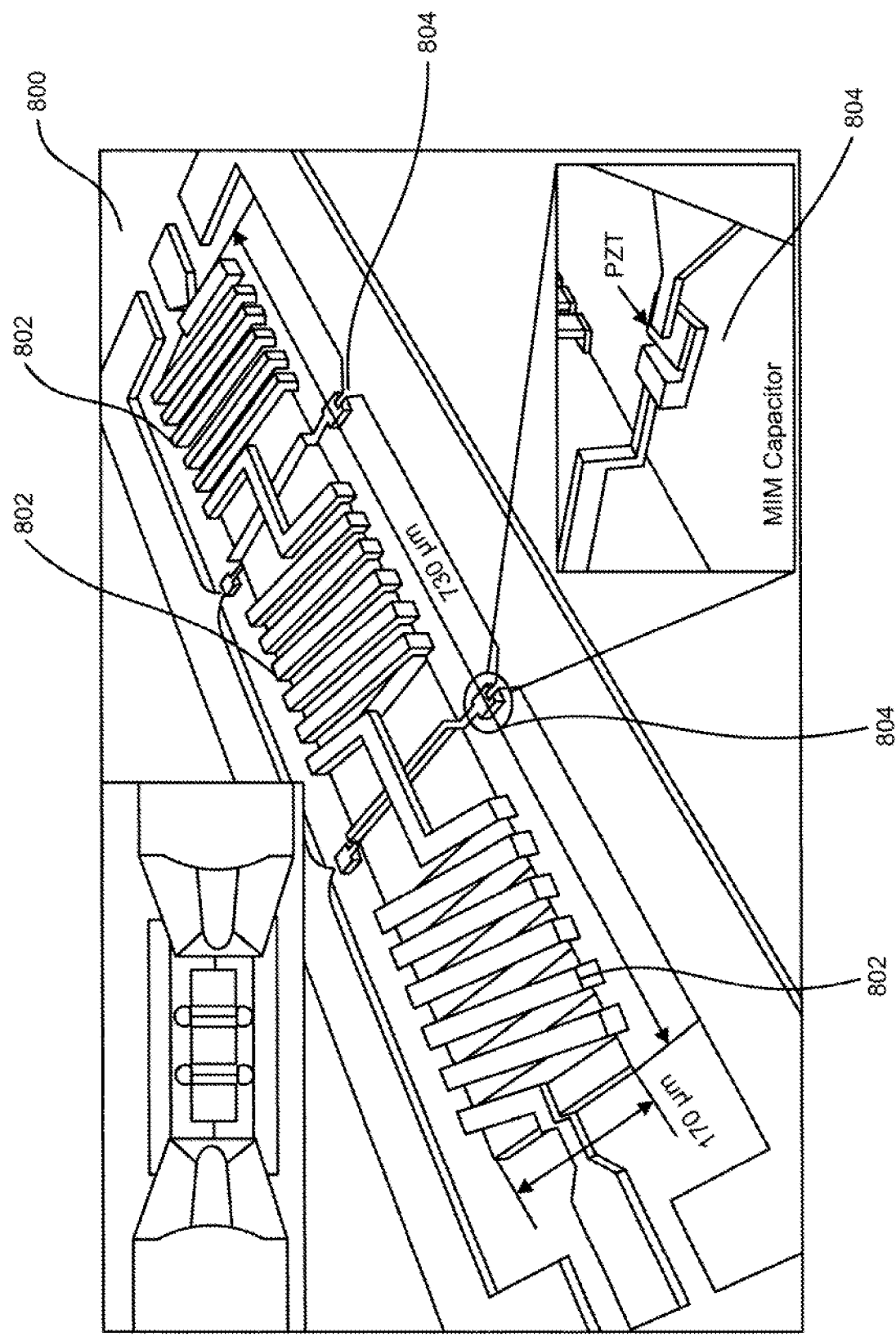
FIG. 8 shows a schematic of Py and PZT enabled tunable phase shifter and magnified view of a MIM capacitor.
Figure 9:
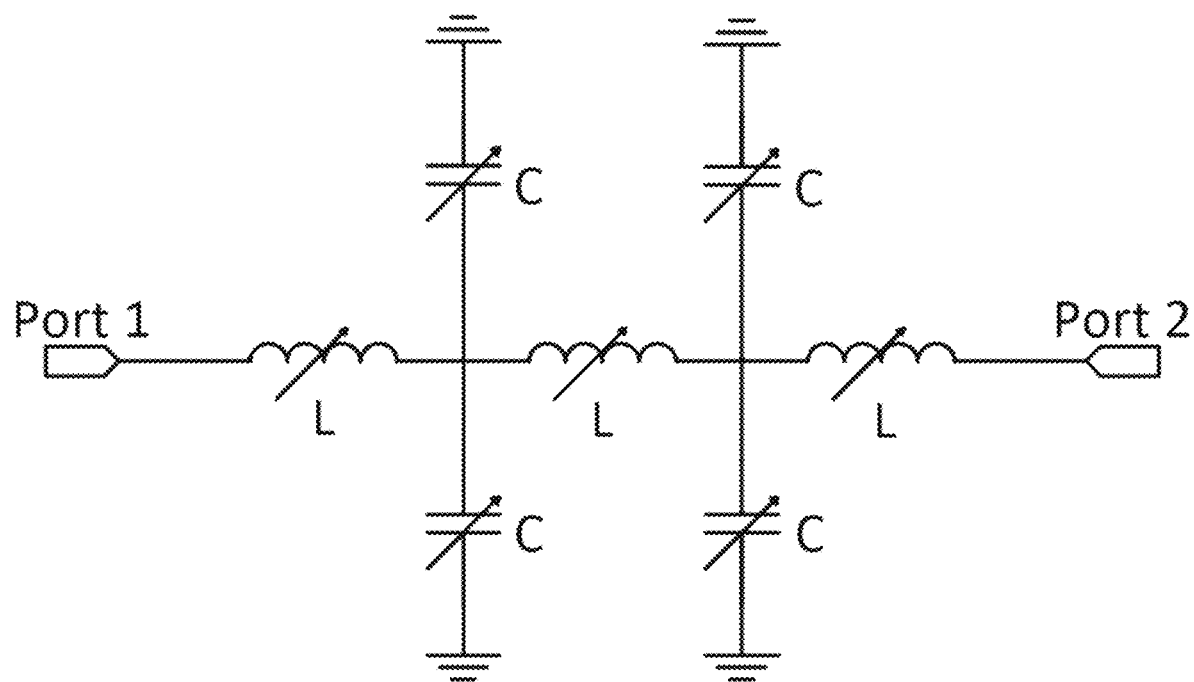
FIG. 9 shows lumped elements equivalent circuit of tunable phase shifter.

FIG. 8 shows the schematic of achieved tunable phase shifter 800, illustrating the circuit topology composed of lumped elements inductor and capacitor. Three tunable solenoid inductors 802 demonstrated in the previous section are used to construct the tunable phase shifter 800 and two pairs of PZT enabled tunable MIM capacitors 804 are in shunt connection with tunable inductors 802. The lumped elements equivalent circuit of the tunable phase shifter is shown in FIG. 9. The ABCD matrix for the lumped elements equivalent circuit, normalized to the characteristic impedance $Z_0$, can be given as $$\begin{vmatrix} A_0 & B_0 \\ C_0 & D_0 \end{vmatrix} = \begin{vmatrix} 1 & X_L \\ 0 & 1 \end{vmatrix} \begin{vmatrix} 1 & 0 \\ 2Y_C & 1 \end{vmatrix} \begin{vmatrix} 1 & X_L \\ 0 & 1 \end{vmatrix} \begin{vmatrix} 1 & 0 \\ 2Y_C & 1 \end{vmatrix} \begin{vmatrix} 1 & X_L \\ 0 & 1 \end{vmatrix} \quad (3)$$

$$= \begin{vmatrix} A_1 & B_1 \\ C_1 & D_1 \end{vmatrix}$$

where $$A_1 = 1 + 2X_L Y_C (3 + 2X_L Y_C) \quad (4)$$

$$B_1 = X_L(1 + 2X_L Y_C)(3 + 2X_L Y_C) \quad (5)$$

$$C_1 = 4Y_C(1 + X_L Y_C) \quad (6)$$

and $$X_L = j\omega L/Z_0 \quad (7)$$

$$Y_C = j\omega C Z_0 \quad (8)$$

where L is the inductance of tunable solenoid inductor implemented in the previous section, which is shown in FIG. 3. C is the capacitance of PZT enabled tunable MIM capacitor, and can be calculated by $C=(\varepsilon_0\varepsilon_r A)/d$ (9) where A is the area of MIM capacitor and d is the distance between top and bottom plates, equivalent to the thickness of the PZT thin film. $\varepsilon_0$ is the permittivity of free space and $\varepsilon_r$ is the relative permittivity of PZT thin film.

The transmission term S21 of S-parameters is calculated as $$S_{21} = \frac{2}{A_0 + B_0 + C_0 + D_0} = \frac{2}{2A_1 + B_1 + C_1} \quad (10)$$

and the transmission phase is denoted by $$\phi_{21} = \tan^{-1}(S_{21}). \quad (11)$$

Figure 10A:
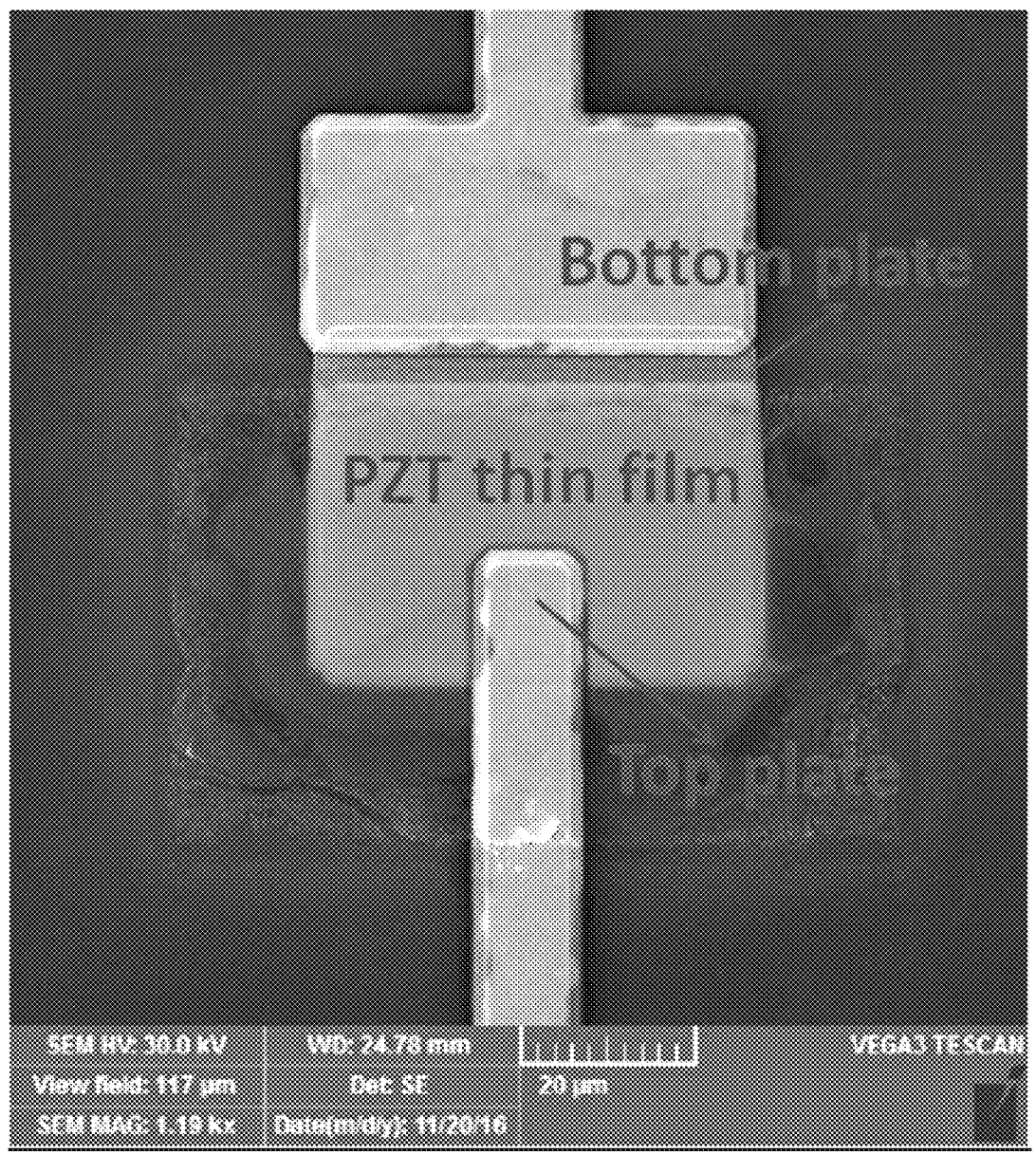
FIG. 10A shows a SEM photograph of a PZT enabled MIM capacitor.

The inductance L can be directly obtained from the measurement data shown in FIG. 4A. To obtain the relative permittivity ($\varepsilon_r$) profile of PZT thin film, a standalone PZT enabled MIM capacitor is fabricated and the relative permittivity is extracted from the measurement data by converting the S-parameters to Y-parameters and then calculating the capacitance. FIG. 10A shows the SEM photo of the fabricated PZT enabled MIM capacitor and the relative permittivity of PZT thin film. The obtained relative permittivity of PZT can be utilized to design tunable MIM capacitor with different dimension.

The phase of the phase shifter can be varied by tuning the inductors and capacitors. The topology and working principle of Py enabled tunable solenoid inductor have been demonstrated in the previous section. For the tunable MIM capacitor design, PZT thin film is used as insulator and is inserted between top and bottom electrodes to form parallel plate capacitor, which can be seen in FIG. 8. The bottom electrode is connected to ground and top electrode is in connection with the solenoid inductor, and the capacitance is determined by the overlapping area of top and bottom plates. When the DC voltage is applied between the two electrodes, the induced electrical field can change the permittivity of PZT thin film and the capacitance can be tuned accordingly.

Fabrication

The process of tunable phase shifter starts with fabricating bottom electrode and PZT thin film of MIM capacitor. The bottom electrode is formed with a Pt/Ti bilayer, which has been widely used with improved adhesion for PZT film. Pt is selected mainly due to its good stability in high temperature and oxidizing environments, which is crucially required during the crystallization process of PZT. Ti is used to promote the adhesion between Pt and substrate. 10-nm thick Ti and 100-nm Pt were first deposited and patterned employing e-beam evaporation and lift-off methods, respectively. PZT precursor was prepared with sol-gel method, and was spin-coated on the substrate. The thickness of PZT was controlled to be 200 nm. Afterwards, PZT thin film was crystallized at 650° C. in the oxygen atmosphere for 30 min, and wet etching method was used to pattern the PZT thin film. After the completion of bottom electrode and PZT thin film, the fabrication of Py enabled solenoid inductor begins and the procedure as shown in FIGS. 2 and 2A. The top electrode of PZT enabled MIM capacitor was finished together with the top Au layer of solenoid inductor by depositing 1-μm thick Au and patterning with lift-off method.

Results and Discussions

The fabricated tunable phase shifter was measured with a similar configuration to test the Py enabled tunable solenoid inductor demonstrated before. In addition to a power source to provide DC current for tuning the inductance of solenoid inductor, another power source was exploited to apply DC voltage for tuning the capacitance of MIM capacitor.

To validate the efficacy of design theory and lumped-element equivalent model of the proposed phase shifter, simulation is conducted with Agilent ADS software and theoretical calculation is performed with (3)-(11). According to FIG. 4A, the inductance (L) of the tunable solenoid inductor is 1.12 nH. The area (A) of the PZT enabled MIM capacitor is 25 μm² (5×5 μm), and the thickness of PZT thin film (d) is 200 nm.

Figure 10B:
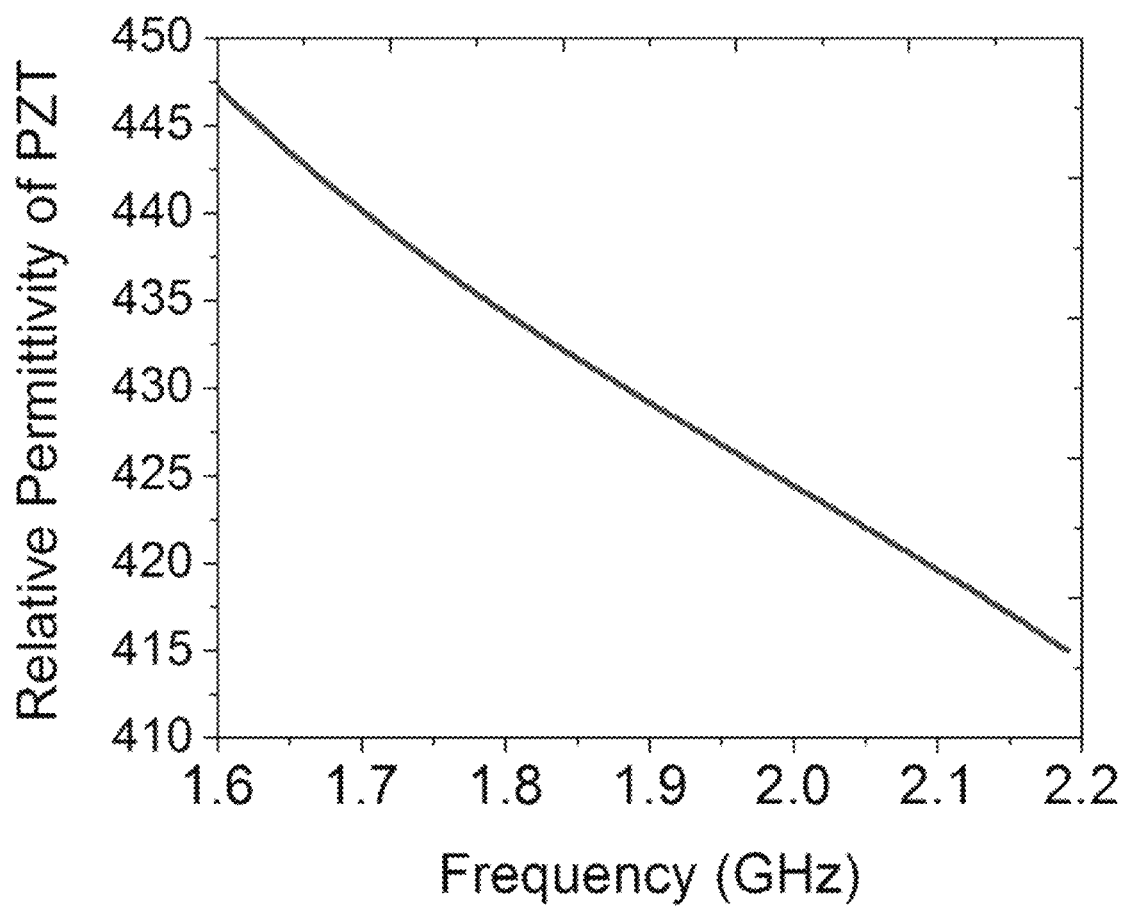
FIG. 10B shows extracted relative permittivity of a PZT thin film.
Figure 11:
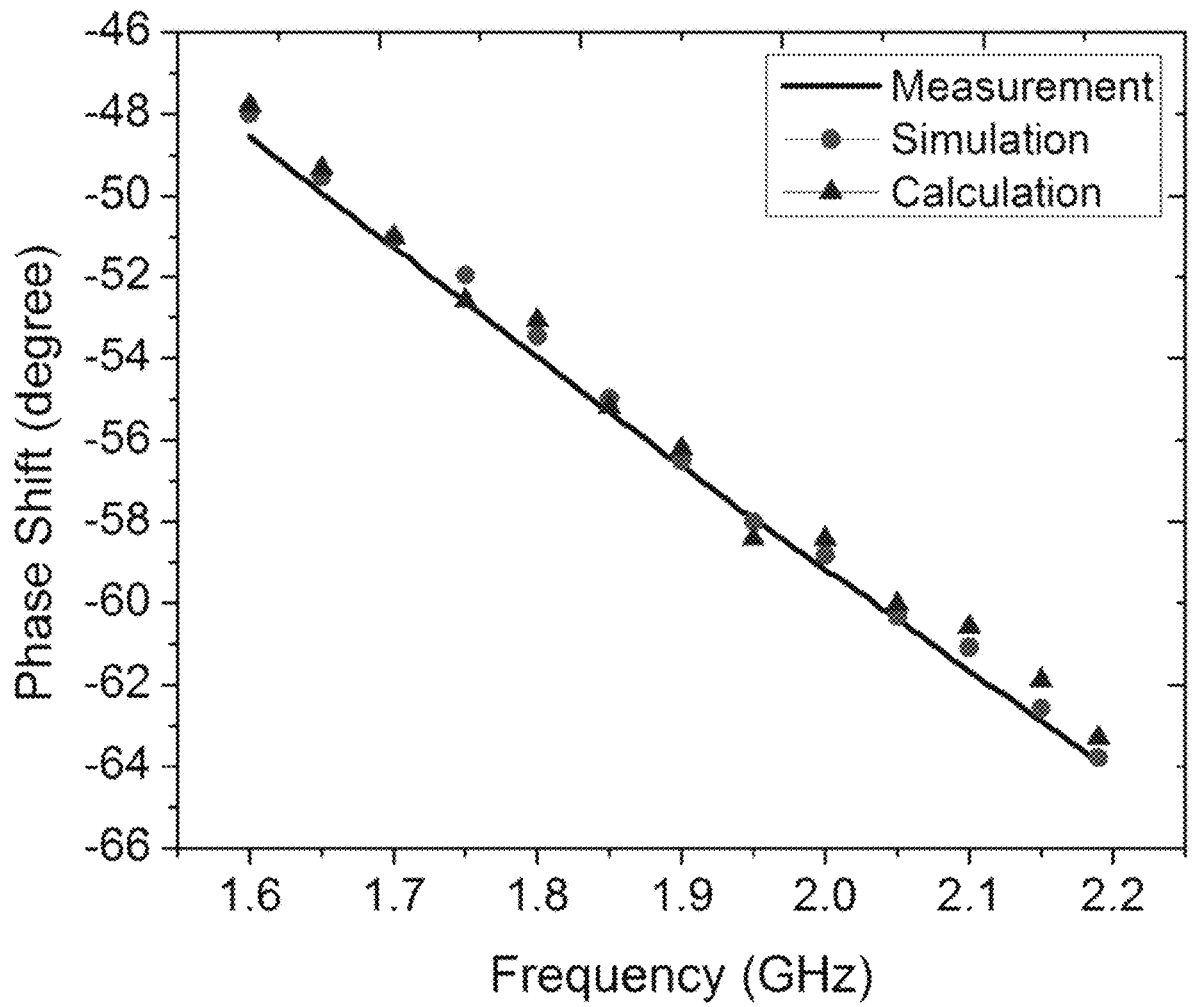
FIG. 11 shows a phase shift comparison among measurement, simulation, and theoretical calculation without DC bias.

The relative permittivity of PZT thin film can be directly obtained in FIG. 10B. The parameters demonstrated above are imported to the simulation and the theoretical calculation, and the results are compared with measurement data. FIG. 11 shows the comparison between simulation, calculation, and measurement results regarding to the phase shift of the device without DC bias, and a good agreement is reached.

Figure 12:
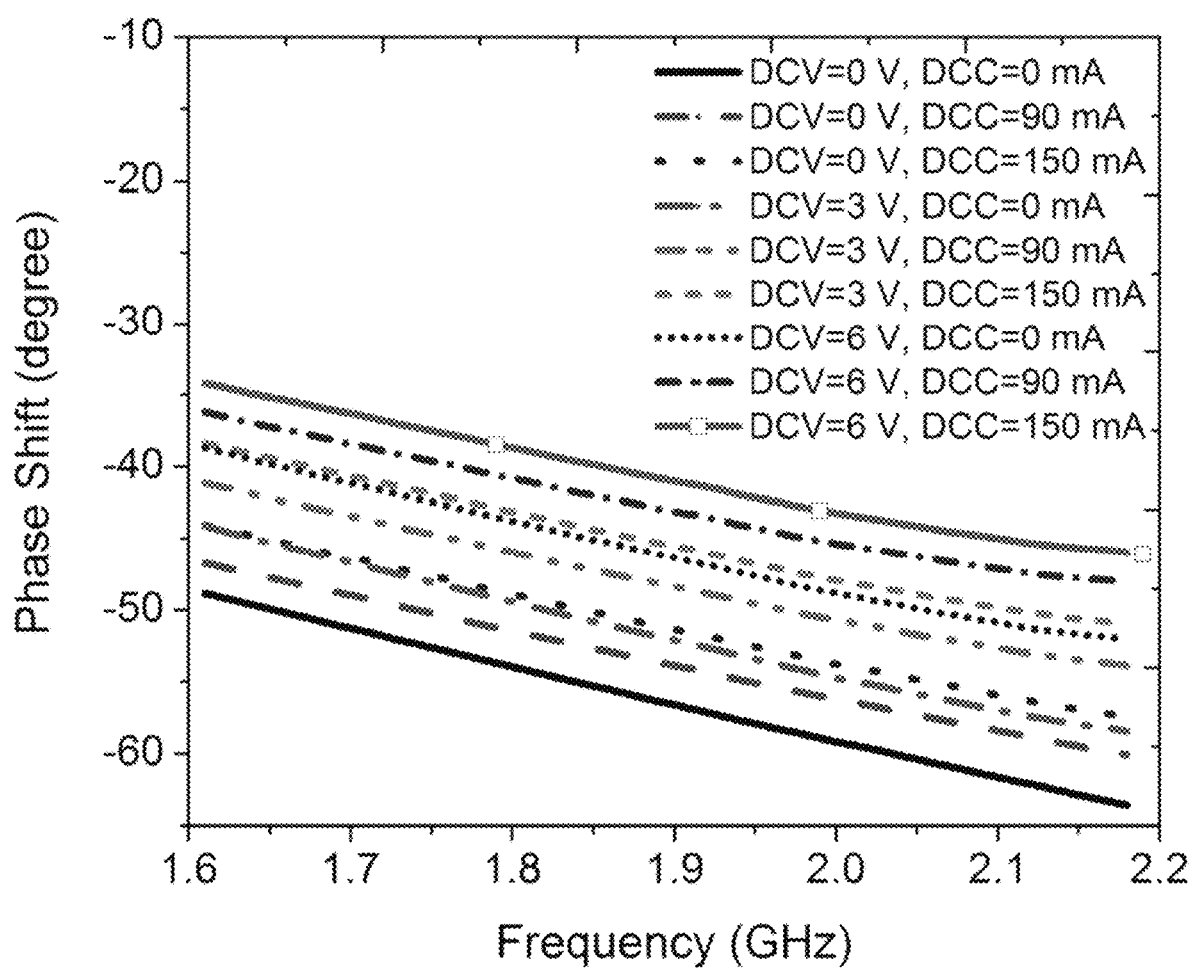
FIG. 12 shows measurement results of a phase shift of a device of the general disclosure versus different frequency under different DC biasing conditions.

FIG. 12 shows the measurement results regarding to phase shift of fabricated tunable phase shifter at different frequency and DC biasing conditions. Continuous phase variation is achieved by providing different dc biasing conditions. DC current and DC voltage can be applied independently or simultaneously to conduct the tuning. Table II summarizes the measurement data at 2 GHz with maximum DC current and/or DC voltage. The phase shift of the phase shifter at 2 GHz is 59.2° without any DC bias. When 150-mA DC current is provided between the two ports of the phase shifter, the phase is changed to 53.8°, which is equivalent to 9.1% tunability. FIG. 13 shows Table II, which provides a summary of phase shift at 2 GHz.

The phase variation is caused by the inductance reduction of solenoid inductors when DC current is provided, which is inductive tunability. The phase of the phase shifter is tuned from 59.2° to 48.8° when DC voltage is applied between the input port and ground, and the tunability is 17.6%. The applied DC voltage generates electrical field between the two electrodes of MIM capacitors and tunes the permittivity of PZT thin film, resulting in the variation of the phase of the device, which is capacitive tunability. When 150-mA DC current and 6-V DC voltage are simultaneously provided, both inductive and capacitive tunability are achieved and the phase is changed from 59.2° to 43.8°, which is equal to 26.9% tunability. Considering the length of the phase shifter is 730 μm, the length normalized tunability is 210°/cm. The inductive and capacitive tunability enable the phase shifter with dual-tuning capability and significantly improve the tuning range and flexibility. Moreover, the tuning can be performed by fully electrical tuning methods with DC current and DC voltage.

In addition, the dual tunability enables the capability to retain the characteristic impedance when phase is being tuned. According to the basic transmission line theory, the characteristic impedance of transmission line is denoted with high frequency low-loss approximation as $$Z_0 = \sqrt{(R+j\omega L)/G(+j\omega C)} \simeq \sqrt{L/C} \qquad (12)$$

where R, L, G, and C represent unit length parameters of series resistance, series inductance, shunt conductance, and shunt capacitance, respectively. Similarly, the electrical length can be described as $$\theta = \omega l \sqrt{LC} \qquad (13)$$

where ω is the angular frequency and l is the physical length of the transmission line.

Figure 14:
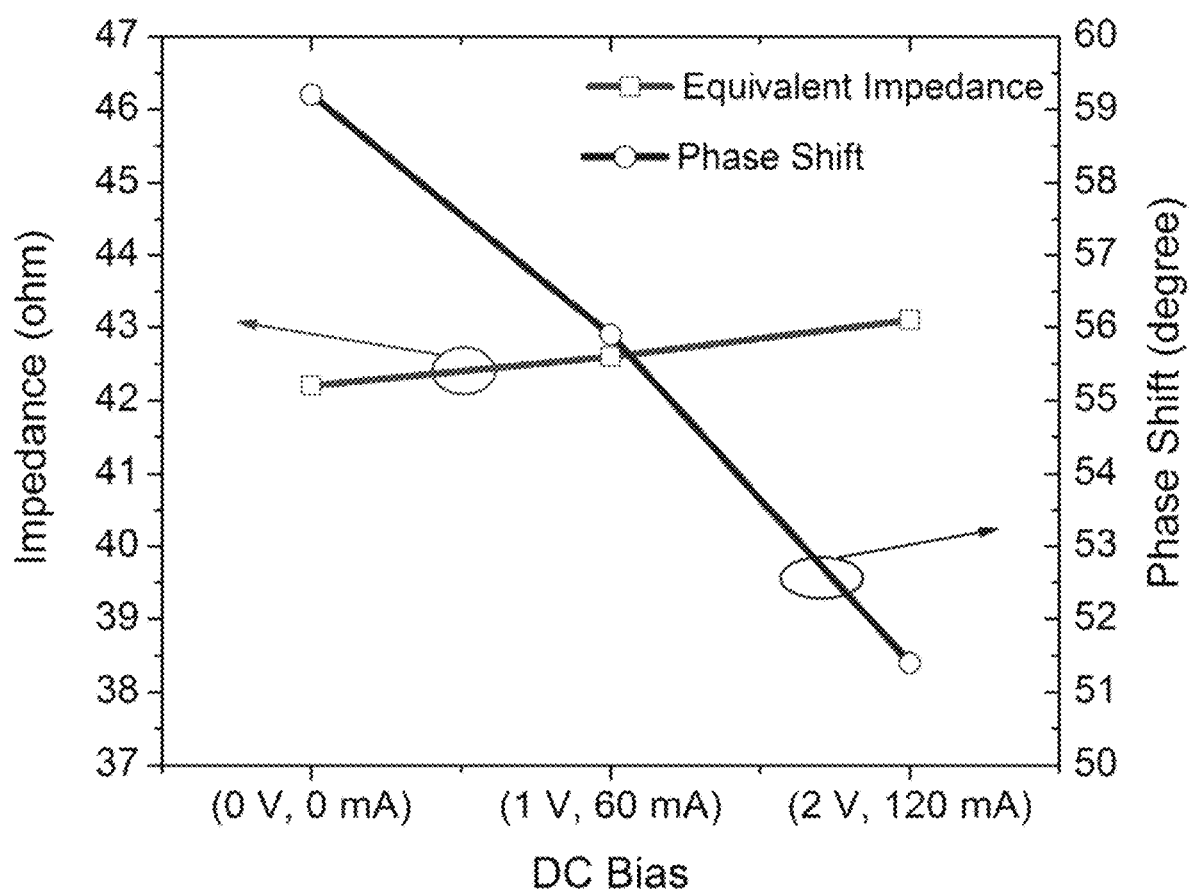
FIG. 14 provides measurement results of equivalent characteristic impedance and phase shift of the device at different frequency and under different DC biasing conditions.

According to (12) and (13), varying L and C with the same ratio can tune the electrical length of transmission line and keep the characteristic impedance the same. Regarding the tunable phase shifter as an equivalent transmission line, the characteristic impedance can be extracted based on the measured S-parameters, adopting the method proposed in W. R. Eisenstadt and Y. Eo, "S-parameter-based IC interconnect transmission line characterization," IEEE Trans. Compon., Hybrids, Manuf. Technol., vol. 15, no. 4, pp. 483-490, August 1992. By carefully providing different DC current and DC voltage combinations, inductors and capacitors of the phase shifter can be tuned with the same ratio to maintain the characteristic impedance while the phase shift is varied. FIG. 14 shows the measurement results at 2 GHz regarding to the characteristic impedance and phase shift of the tunable device under different DC bias combinations. By carefully selecting DC current and DC voltage, the phase is tuned from 59.2° to 51° while the variations of characteristic impedance is within 1 ohm, which effectively proves the concept and validates the efficacy of dual tunability to maintain the same impedance.

Figure 15:
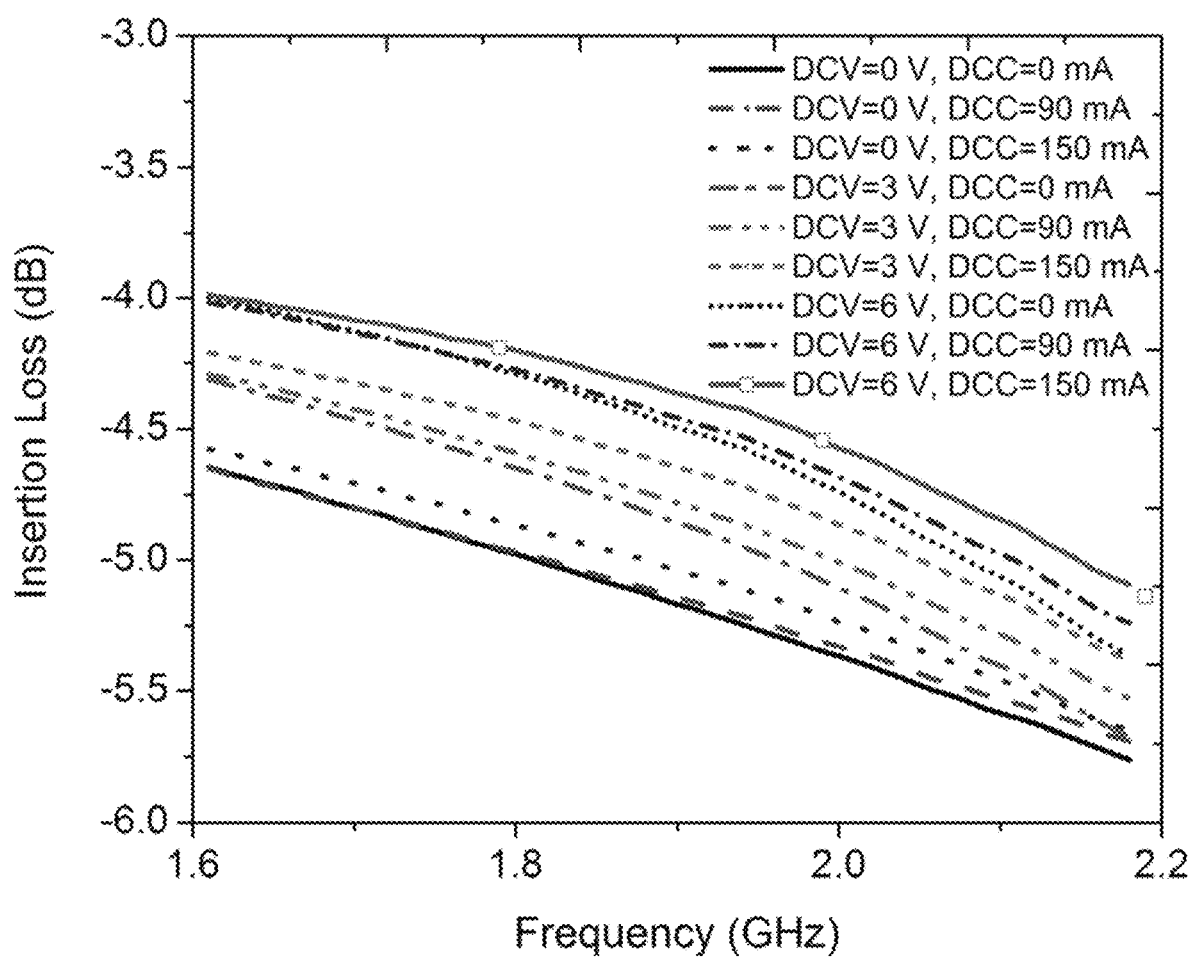
FIG. 15 shows measurement results of insertion loss at different frequency under different DC biasing conditions.

In addition to the phase shift tunability, the loss of phase shifter is also investigated. FIG. 15 depicts the measured results of insertion loss and the tunable shifter shows around 5-dB loss. According to the measured results of previous section, the insertion loss of a tunable solenoid inductor at 2 GHz is about 1.4 dB. Since the tunable phase shifter is composed of 3 inductors, the conclusion can be drawn that the relatively large insertion loss of phase shifter is primarily from the tunable solenoid inductor, which is mainly due to the small thickness of Au and integration of Py thin film. The performance of the phase shifter can be denoted by the figure-of-merit (FOM) of degree per unit loss. Considering the phase shift of 59.2° and 5-dB loss at 2 GHz, the calculated FOM is 11.84°/dB.

Table III, see FIG. 16, summarizes the length normalized phase tunability, FOM and biasing conditions for tuning of the state-of-art literature. Significantly higher length normalized phase tenability is achieved due to the compact lumped elements structure composed of thin films enabled tunable solenoid inductors and MIM capacitors, and the capability of dual tunability. Tuning of the phase is realized by fully electrical methods with DC current and DC voltage, and no external biasing magnetic field is required, which avoids the integration issue.

A 3-D electrically tunable solenoid inductor enabled by Py thin film has been proposed and fabricated. The fabrication process employing surface micromachining technique is introduced in detail. Special configuration of magnetic core is utilized, and with selectively patterning of Py thin film, the implemented solenoid inductor is able to work in GHz range. The inductance of the solenoid inductor can be electrically tuned by DC current contributed by the tunable permeability of Py, and given 150-mA DC current, the inductance can be varied over 10%. The proposed Py enabled tunable solenoid inductor is utilized to construct tunable lumped elements phase shifter together with PZT enabled MIM capacitor. The proposed tunable phase shifter has both inductive and capacitive tunability, and the capability of dual tunability significantly improves the phase tuning range and design flexibility. The tuning is conducted by fully electrical methods, and the maximum length normalized phase variation has reached to 210°/cm at 2 GHz when 150-mA DC current and 6-V DC voltage are provided. Moreover, the dual tunability introduces the advantage of impedance retaining. With tunable phase shift, the equivalent characteristic impedance of the phase shifter can be kept almost constant by providing selectively DC biasing conditions. Compared with previous work, due to the novel combined utilization of tunable 3-D solenoid inductor and tunable MIM capacitor, the required DC bias is significantly reduced while the electrical tunability is greatly improved.

The larger dual tunability compared with previous work also noticeably enables the impedance retaining capability. The proposed tunable components and design methodology can be widely exploited to design arbitrary tunable microwave components, such as tunable bandpass and bandstop filters. The dual tunability and impedance retaining capability is especially useful in designing LC impedance matching network.

While the present subject matter has been described in detail with respect to specific exemplary embodiments and methods thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art using the teachings disclosed herein.

What is claimed is:

1. An electrically tunable phase shifter comprising:
   wherein the electrically tunable phase shifter is comprised of a compact 3-D structure comprising at least one thin film tunable solenoid inductor and at least one metal-insulator-metal capacitor;
   wherein the electrically tunable phase shifter has dual tunability via having the at least one thin film tunable solenoid inductor comprised of at least one ferromagnetic material to provide inductive tuning and the at least one metal-insulator-metal capacitor comprised of at least one ferroelectric material to provide capacitive tuning; and
   wherein the electrically tunable phase shifter has continuous tunability when different biasing DC currents are provided to the at least one.

2. The electrically tunable phase shifter of claim 1, wherein when phase is tuned over a range impedance is kept constant.

3. The electrically tunable phase shifter of claim 1, wherein the at least one tunable solenoid inductor comprises Permalloy.

4. The electrically tunable phase shifter of claim 3, wherein the Permalloy comprises a nickel-iron magnetic alloy.

5. The electrically tunable phase shifter of claim 1, wherein the at least one tunable metal-insulator-metal capacitor comprises lead zirconate titanate (PZT).

6. The electrically tunable phase shifter of claim 1, wherein the phase shifter is tuned fully electrically by DC current and DC voltage simultaneously or separately without introducing an extra biasing network via DC current and DC voltage applied between at least two ports of the electrically tunable phase shifter and between at least one of the at least two ports and a ground, respectively, so no extra biasing network components are needed.

7. The electrically tunable phase shifter of claim 1, wherein the electrically tunable phase shifter providing dual tunability increases length normalized phase tunability up to at least 210 degree/cm.

8. The electrically tunable phase shifter of claim 1, wherein equivalent characteristic impedance of the phase shifter is substantially constant via providing selectively DC biasing conditions.

9. The electrically tunable phase shifter of claim 1, wherein the at least one tunable solenoid inductor comprises a thin film enabled tunable 3-D solenoid inductor.

* * * * *